(12) United States Patent
Shirakawa

(10) Patent No.: US 7,679,977 B2
(45) Date of Patent: Mar. 16, 2010

(54) SEMICONDUCTOR MEMORY DEVICE AND TEST METHOD THEREOF

(75) Inventor: Masanobu Shirakawa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 59 days.

(21) Appl. No.: 11/773,119

(22) Filed: Jul. 3, 2007

(65) Prior Publication Data

US 2008/0123409 A1    May 29, 2008

(30) Foreign Application Priority Data

Jul. 5, 2006   (JP)   ............... 2006-185680

(51) Int. Cl.
*G11C 29/00* (2006.01)

(52) U.S. Cl. ............. 365/201; 365/185.17; 365/185.24; 365/185.18; 365/185.12

(58) Field of Classification Search ................. 365/201, 365/235, 185.17, 185.03, 185.12, 185.18, 365/189.011
See application file for complete search history.

(56) References Cited

U.S. PATENT DOCUMENTS

| 5,682,346 | A  | 10/1997 | Yamamura et al. |
| 6,819,596 | B2 | 11/2004 | Ikehashi et al. |
| 6,898,119 | B2 * | 5/2005 | Imamiya et al. ........ 365/185.09 |
| 6,940,752 | B2 | 9/2005 | Tanaka et al. |

FOREIGN PATENT DOCUMENTS

JP    2004-46985    2/2004

* cited by examiner

*Primary Examiner*—J. H. Hur
*Assistant Examiner*—Tha-O Bui
(74) *Attorney, Agent, or Firm*—Oblon, Spivak, McClelland, Maier & Neustadt, L.L.P.

(57) ABSTRACT

A semiconductor memory device including a memory cell array with electrically rewritable and non-volatile memory cells arranged therein, wherein the device has such a test mode that includes a page searching sequence for searching a fast page with the fastest write speed in the memory cell array.

14 Claims, 17 Drawing Sheets

SEMICONDUCTOR MEMORY DEVICE AND TEST METHOD THEREOF

CROSS-REFERENCE TO RELATED APPLICATION

This application is based on and claims the benefit of priority from the prior Japanese Patent Application No. 2006-185680, filed on Jul. 5, 2006, the entire contents of which are incorporated herein by reference.

BACKGROUND OF THE INVENTION

1. Field of the Invention

This invention relates to a semiconductor memory device, specifically to an EEPROM flash memory with electrically rewritable and non-volatile memory cells arranged therein and write voltage setting method thereof.

2. Description of the Related Art

A NAND-type flash memory is known as one of EEPROMs (Electrically Erasable and programmable ROMs), which has features as follows: the unit cell area is smaller than that of a NOR-type one; and it is easy to increase the capacitance. Recently, by use of multi-level data storage scheme, in which one cell stores two or more bits, it has been developed a NAND-type flash memory with a further increased capacitance.

Conventionally, in a normal NAND-type flash memory, one page data write is performed at a time. In this data write, it is basically used such a "verify-write scheme" that a write cycle is repeatedly performed with write voltage application and verify-read for verifying the write data until one page data has been completely written. Further, since it is in need of precisely controlling the data threshold distributions, a "write voltage step-up scheme" is used, in which write voltage Vpgm is stepped-up by $\Delta$Vpgm for every write cycle.

The less the step-up voltage $\Delta$vpgm, the less the cell's threshold change in one write operation. Therefore, to make the data threshold distributions narrow, and to secure the data reliability, it is required to set the step-up voltage $\Delta$Vpgm to be as small as possible. This requirement is strong especially in a multi-value data storage scheme.

However, if the step-up voltage is too small, it is necessary to take a large number of write cycles "n" (i.e., loop number) until a desired write state is obtained. The increase of the loop number leads to write time increasing, so that the write performance will be reduced.

As described above, the step-up voltage $\Delta$Vpgm and the loop number "n" are mutually related. To satisfy a write speed specification, it is necessary to decide the upper limit of the number of write cycles, which will be defined as the maximum loop number NLP. In case data write is not yet completed when loop number has reached the maximum loop number NLP, the corresponding page is dealt with a defective one.

Although the maximum loop number NLP and the step-up voltage $\Delta$Vpgm are fixedly set, in consideration of them, the initial value of write voltage Vpgm will be trimmed to achieve a desirable write state. In detail, to make the data write possible to be finished within the maximum loop number NLP, a suitable Vpgm initial value will be set.

The Vpgm initial value trimming is usually performed in a built-in self test (BIST) at a wafer stage. The trimming value will be programmed in a ROM fuse circuit together with other, various initial set-up data. Recently, it has been provided such a scheme that the ROM fuse circuit is set in a memory cell array in place of a mechanical fuse circuit (for example, refer to JP-P2002-117699A).

SUMMARY OF THE INVENTION

According to an aspect of the present invention, there is provided a semiconductor device including a memory cell array with electrically rewritable and non-volatile memory cells arranged therein, wherein the device has such a test mode that includes a page searching sequence for searching a fast page with the fastest write speed in the memory cell array.

According to another aspect of the present invention, there is provided a test method of a semiconductor memory device, which has a memory cell array with electrically rewritable and non-volatile memory cells arranged therein, including:

a page searching sequence for searching a fast page with the fastest write speed in the memory cell array; and a voltage trimming sequence for executing data write into the fast page to obtain a suitable write voltage initial value.

DETAILED DESCRIPTION OF THE EMBODIMENTS

To trim a write voltage (Vpgm) initial value in a wafer test, i.e., BIST, in a flash memory, a write sequence is usually executed with a low Vpgm initial value provisionally set. In case this data write is not passed in spite of the write cycle has reached the maximum loop number, the following write sequence will be repeated with the write voltage Vpgm stepped-up. Thus data write is continued to be passed under the maximum loop number. Further, the same write sequences are executed for multiple pages, and the Vpgm initial value is set to satisfy such a condition that data write is certainly completed within the maximum loop number.

However, in the above-described Vpgm initial value setting method, the write speed of each memory cell is not usually taken into consideration. Specifically, in a miniaturized flash memory, it is necessary to consider the data change due to capacitive coupling between adjacent memory cells. If it is not taken into consideration, it becomes impossible to obtain a suitable Vpgm initial value.

In consideration of the above-described situation, in the present invention, the Vpgm initial value will be trimmed under the condition that a memory cell with a fast write speed is searched, and data change due to capacitive coupling between adjacent memory cells is taken into consideration.

Illustrative embodiments of this invention will be explained with reference to the accompanying drawings below.

Figure 1:
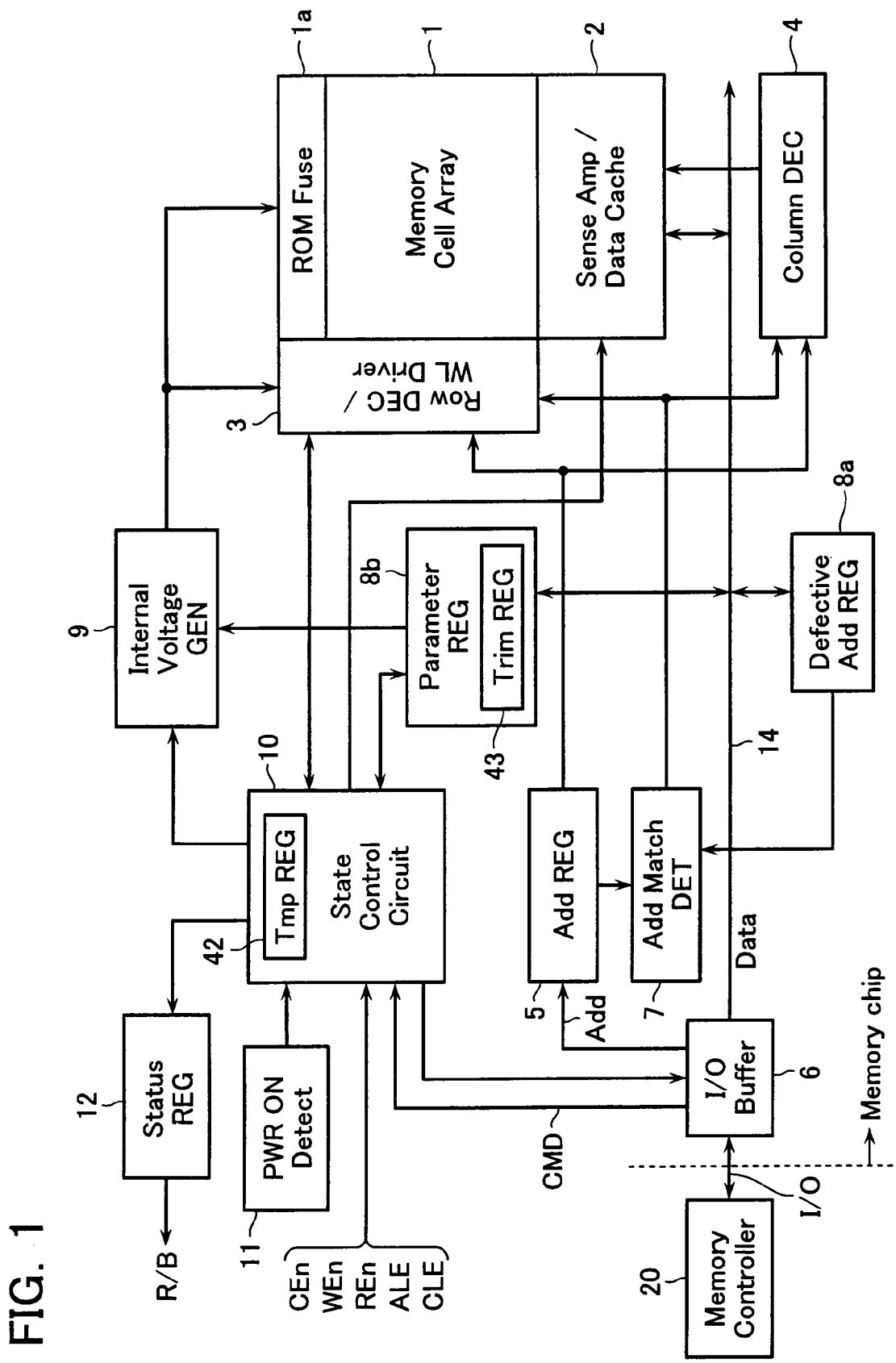
FIG. 1 shows a functional block of a flash memory in accordance with an embodiment of the present invention.
Figure 2:
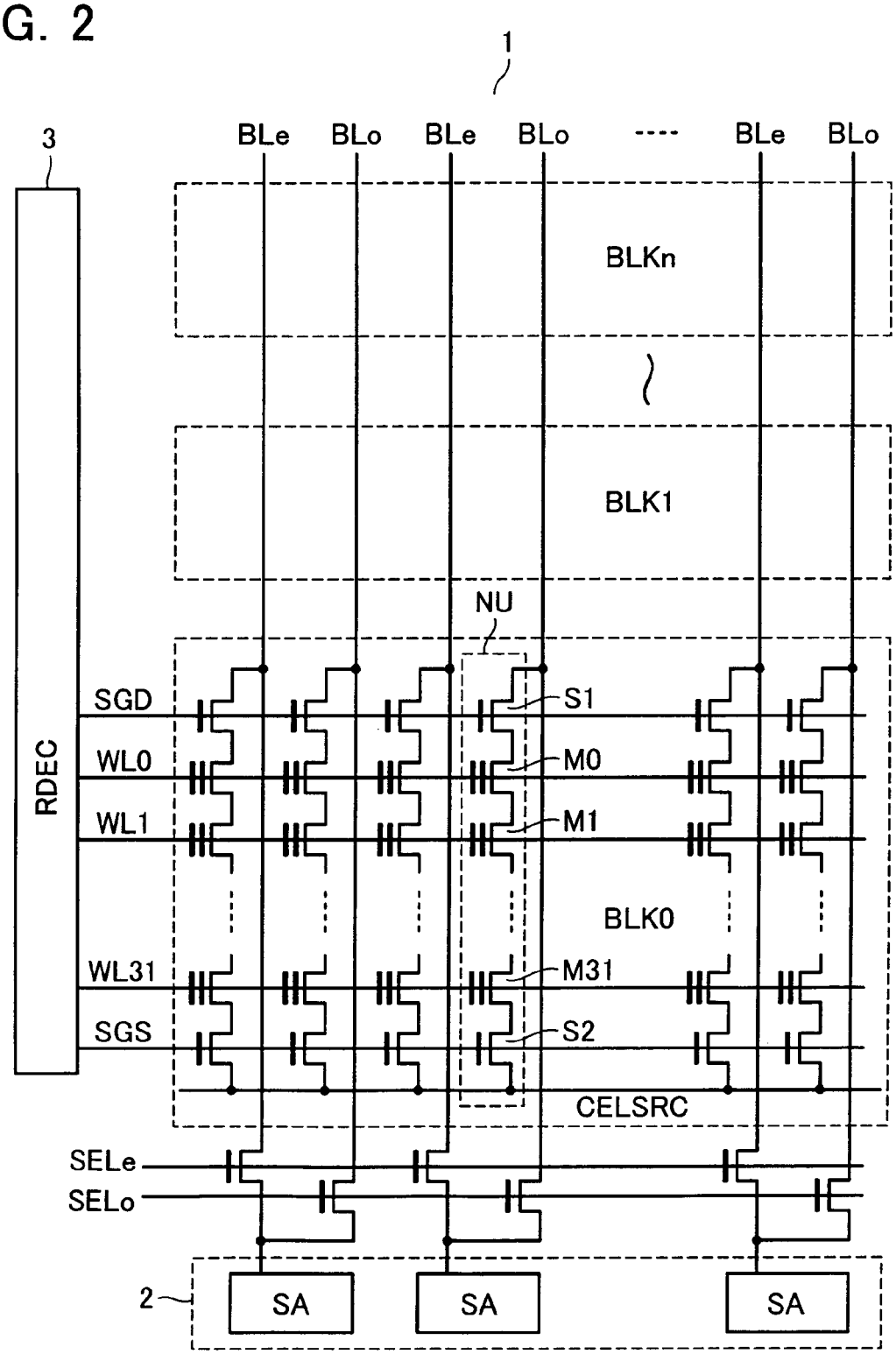
FIG. 2 shows a memory cell array of the flash memory.

FIG. 1 shows a functional block of a flash memory in accordance with this embodiment; and FIG. 2 the memory cell array 1.

Memory cell array 1 is, as shown in FIG. 2, formed of NAND cell units NU arranged in a matrix manner. Each NAND cell unit NU has a plurality of (thirty two in the example shown in FIG. 2) electrically rewritable and non-volatile memory cells M0-M31 connected in series, and select gate transistors S1 and S2 for coupling both ends thereof to a bit line BLe (or BLo) and a source line CELSRC, respectively.

Control gates of memory cells in the NAND cell unit NU are coupled to different word lines WL0-WL31. Gates of select gate transistors S1 and S2 are coupled to select gate lines SGD and SGS, respectively.

A set of NAND cell units sharing word lines WL0-WL31 constitutes a block serving as an erase unit. As shown in FIG. 2, multiple blocks BLK (BLK0, BLK1, ... ) are arranged in the direction of the bit line.

Row decoder 3 includes word line drivers and select gate line drivers for selectively driving word lines and select gate lines in accordance with row address. Sense amplifier circuit 2 has an array of sense amplifiers SA coupled to bit lines for reading data by a page, which serve as data latches for storing one page write data. With this sense amplifier circuit 2, data read and write are performed by a page. Sense amplifier circuit 2 includes data caches for transmitting/receiving data between data bus and itself.

In the example shown in FIG. 2, it is used such a sense amplifier scheme that adjacent two bit lines BLe and BLo share one sense amplifier SA. Adjacent two bit lines BLe and BLo are selectively coupled a sense amplifier SA via a bit line select gate.

Data transfer between the sense amplifier circuit 2 and external input/output terminals I/O is performed via I/O buffer 6 and data bus 14. Attached to the sense amplifier circuit 2 is a column gate circuit controlled by column decoder 4. Assuming, for example, that there are eight I/O terminals I/O (I/O0-I/O7), serial data transfer is performed between the sense amplifier 2 and I/O terminals by a Byte (i.e., by a column) in accordance with column controlling.

Address "Add" supplied from the I/O terminals is transferred to row decoder 3 and column decoder 4 via address register 5. Command "CMD" supplied from the I/O terminals is decoded in state control machine (refer to as an internal controller hereinafter) 10.

The internal controller 10 executes data write and erase sequences and controls read operation based on various control signals (write enable signal WEn, read enable signal REn, command latch enable signal CLE, address latch enable signal ALE and the like), which are externally supplied from external memory controller (refer to as an external controller hereinafter) 20, and command "CMD".

Explaining in detail, this memory chip and external controller 20 are integrally installed to constitute a memory card. A host device using this memory chip supplies a required command(s) via the external controller 20 to set a suitable operation mode, thereby performing data read and write.

Internal voltage generation circuit 9 is controlled by internal controller 10 to generate various internal voltages required in the memory operation modes, in which boost circuits are prepared for generating voltages higher than the power supply voltage. Status register 12 is for outputting a status flag R/B outside the chip, which designates whether the chip is in a ready state of data write, erase or read or in a busy state.

Data registers 8a and 8b are for storing various initial set-up data, by which memory operation conditions are defined. Explaining in detail, register 8a is a defective column address register for storing defective column address data in the initial set-up data while register 8b is a parameter register for storing various parameter data such as timing trimming data and voltage trimming data, which are used for trimming various timing signals and various internal voltages generated from the internal voltage generator 9.

As explained in detail later, in this embodiment, a new setting scheme is adapted to the register 8b with respect to the write voltage (Vpgm) initial value to be stored.

Data to be stored in these registers 8a and 8b are previously written in an initial set-up data storing block (ROM fuse block) 1a set in the memory cell array 1. When power is on, power-on detecting circuit 11 detects it, and internal controller 10 automatically executes such an initial set-up operation in response to the power-on detect signal that the initial set-up data are read out the ROM fuse block 1a, and transferred to and set in the registers 8a and 8b.

Address match detecting circuit 7 is for detecting whether an externally supplied column address is identical with one of the defective column addresses or not to output an address replacing control signal. As a result, it is performed such a control that a redundant column is selected in pace of a defective column.

Figure 3:
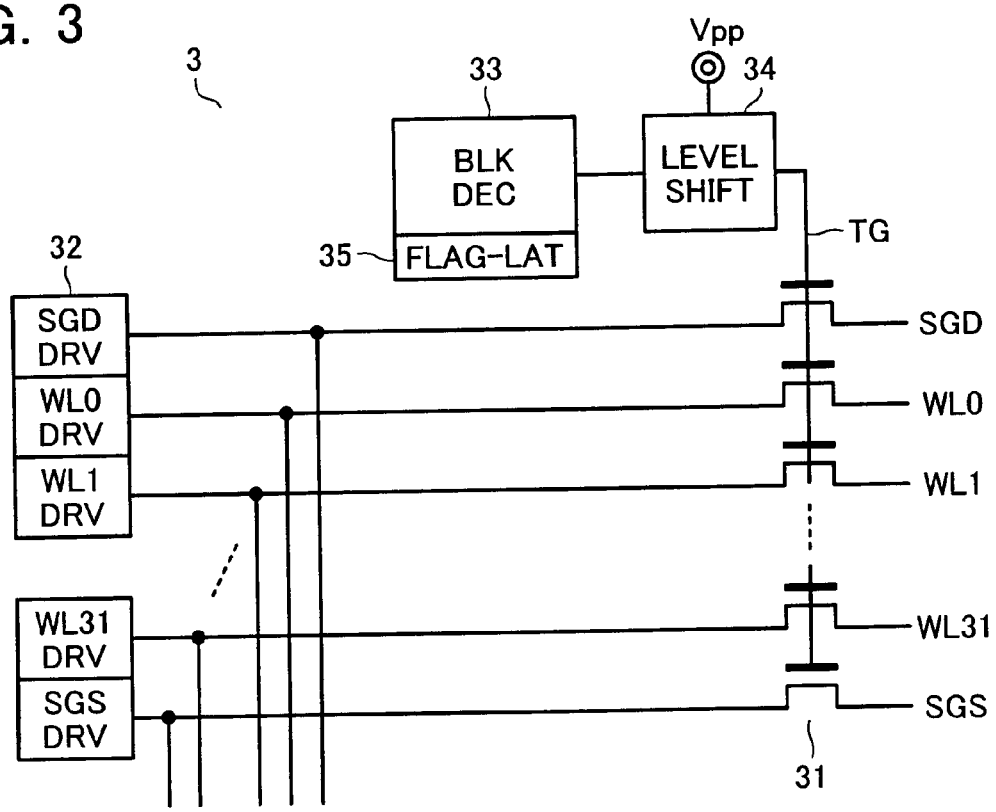
FIG. 3 shows a row decoder of the flash memory.

FIG. 3 shows the detailed configuration of the row decoder 3, which has a transfer transistor array 31 for supplying drive voltages to word lines WL0-WL31 and select gate lines SGD and SGS, and a block decoder 33 for selecting a block to drive the common gate TG of the transistor array 31.

The output of block decoder 33 is input to a level shift circuit 34, in which high voltage Vpp generated from the voltage generation circuit 9 is set at a suitable level and transferred to the common gate TG of the transfer transistor array 31.

A group of drivers 32 is shared by all blocks, which includes word line drivers WL0DRV-WL31DRV and select gate line drivers SGDDRV and SGSDRV for generating driving voltages necessary for driving word lines WL0-WL31 and select gate lines SGD and SGS. The driving voltages are supplied into a selected block via the transfer transistor array 31, which is on-driven.

Attached to the block decoder 33 is a flag data latch 35 for storing a defective block flag. In case the defective block flag is set in this latch 35, even if the corresponding block is accessed, the block decoder 33 is kept in an inactive state, so that word lines and select gate lines in the corresponding block are not driven.

Figure 4:
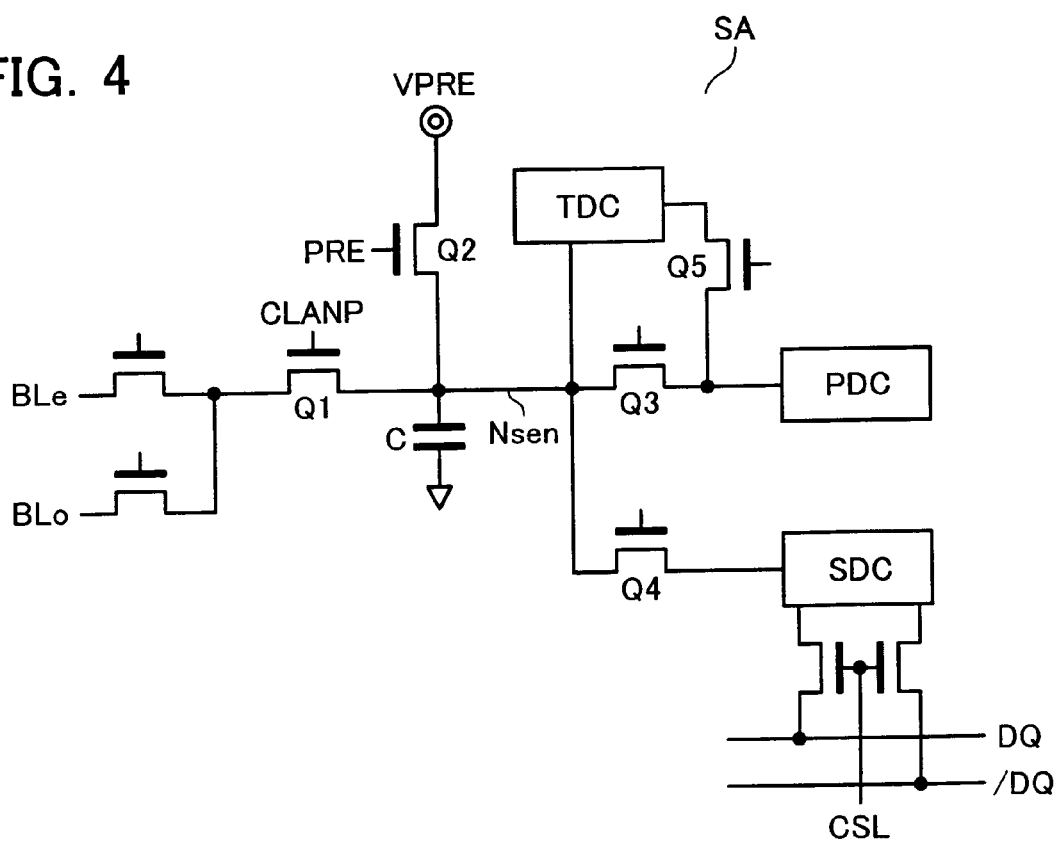
FIG. 4 shows a sense amplifier circuit of the flash memory.

FIG. 4 shows a configuration of a sense amplifier SA in the sense amplifier circuit 2. Sense node Nsen is coupled to a bit line BLe or BLo via clamping NMOS transistor Q1. Connected to the sense node Nsen are precharge NMOS transistor Q2, which precharges a bit line via clamping transistor Q1, and capacitor C for holding data charge.

Sense node Nsen is further coupled to a first data storage circuit PDC via transfer NMOS transistor Q3. The first data storage circuit PDC is, for example, a data latch for storing read data and write data.

Sense node Nsen is still further coupled to a second data storage circuit SDC via transfer NMOS transistor Q4. The second data storage circuit SDC serves as a caching data latch, which is used for data transferring between the sense amplifier and the external. Therefore, it is coupled to data lines DQ, /DQ via column gates driven by a column select signal.

To rewrite the write data stored in the data storage circuit PDC in accordance with the verity-read result obtained at every write cycle, another data storage circuit TDC is prepared. That is, write data stored in data storage circuit PDC is transferred to and temporally stored in data storage circuit TDC via transfer transistor Q5 at each write cycle. With this data storage circuit TDC, such a control is performed that the following write data is determined by a logic between data in data storage circuit TDC and verify-read result, and is written back to data storage circuit PDC.

In a multi-level data storage scheme, for example in a four-level data storage scheme, it is in need of performing two page write operations. Explaining in detail, it is required to refer to the upper page data when writing the lower page data, or it is required to refer to the lower page data when writing the upper page data. Suppose here that the upper page data is written with reference to the lower page data.

In this case, the upper page data to be written is, for example, stored in the first data storage circuit PDC while the lower page data is read out the memory cell array, if it has been written in the memory cell array, and stored in the second data storage circuit SDC. The verify-write of the upper page data will be controlled with reference to the lower page data.

Figure 5:
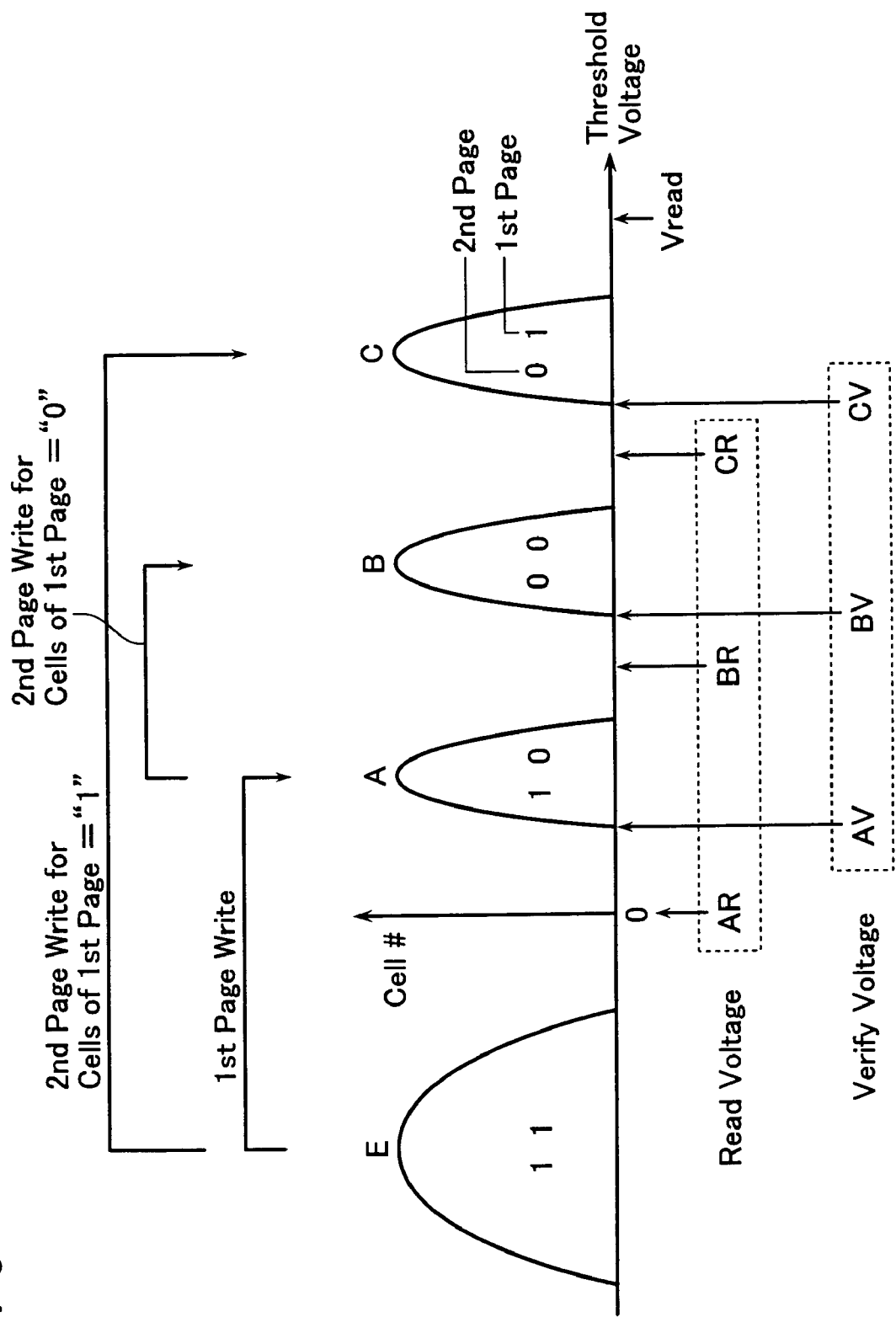
FIG. 5 shows four-level data threshold distributions of the flash memory.

FIG. 5 shows data threshold distributions and data bit assignment thereto in the four-level data storage scheme in a flash memory in accordance with this embodiment.

Data state "E" with a negative threshold voltage is an erase state. Data states "A", "B" and "C", which have threshold voltages increased in this order, are written from erase state "E". Suppose that, for example, four-level data is expressed by "xy" where "y" is a first page data (for example, the lower page data); and "x" a second page data (for example, the upper page data), data "11", "10", "00" and "01" are assigned to data states "E", "A", "B" and "C", respectively.

Previous to data write, data erase is performed by a block in such a way that all word lines in a selected block are set at 0V; and p-type well, on which the memory cell array is formed, is applied with erase voltage Vera. With this voltage application, electrons in the floating gates of all cells are discharged to channels thereof, so that the erase state "E" will be obtained in all cells.

Data write is performed by a page. In case of the data bit assignment shown in FIG. 5, first, the first page write is performed to selectively increase the threshold voltages of cells with data state "E" to that of data state "A". Following it second page write is performed to selectively increase the threshold voltages of data states "E" and "A" to those of data states "C" and "B", respectively. That is, as the second page write, data write for selectively writing data "C" into data "E" cells, and data write for selectively writing data "B" and "C" into data "A" cells are performed simultaneously in parallel.

The lower limit of the threshold distribution of data "A" at the first page write time is defined by a verify voltage AV, which is applied to a selected word line at a verify-read time. At the second page write time, it is in need of performing two verify-reads for verifying data states "B" and "C". The lower limits of the threshold distributions of data "B" and "C" at the second page write time will be defined by verify voltages BV and CV, which are applied to the selected word line at the respective verify-read times.

Figure 6:
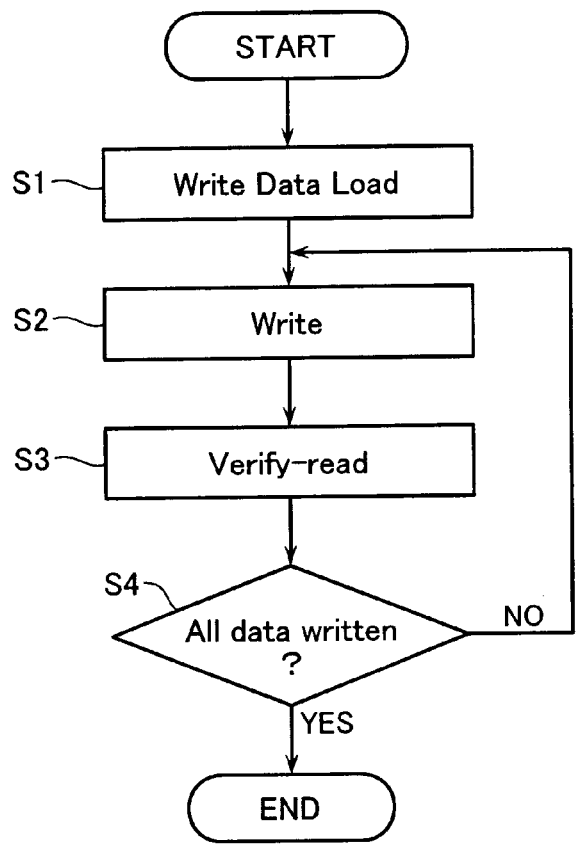
FIG. 6 shows a lower page write sequence of the flash memory.

FIG. 6 shows a first page write sequence. After loading to-be-written lower page data (step S1), write (step S2) and write-verify (step S3) are repeatedly performed until it is detected that all write data have been completely written (step S4).

Figure 8:
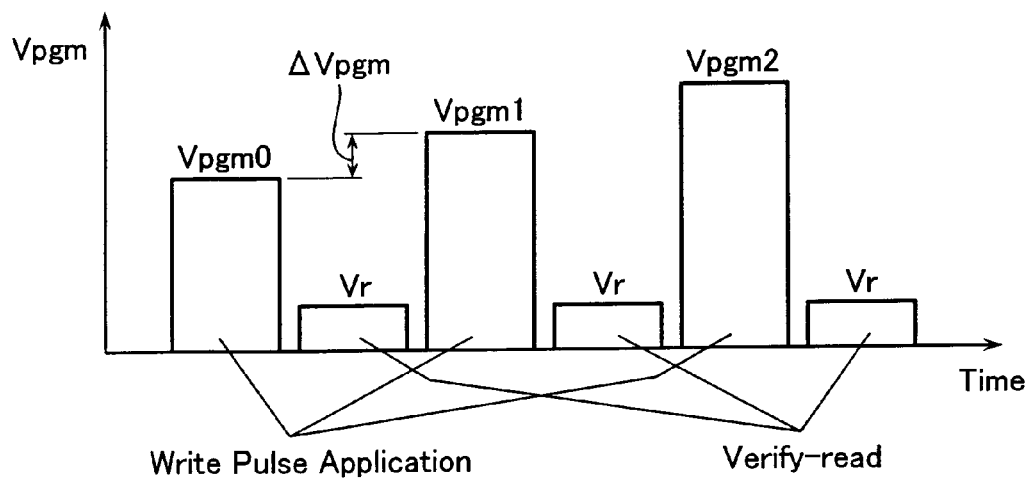
FIG. 8 shows write voltage pulses used in the flash memory.

FIG. 8 shows such a situation that the write voltage Vpgm is changed from the initial value Vpgm0 with a step-up voltage ΔVpgm.

The write step S2 is so performed as to inject electrons into floating gates selected in accordance with write data under the condition that the selected word line is applied with the boosted write voltage Vpgm; and non-selected word lines are applied with pass voltage Vpass. In detail, previous to applying the write voltage, selected cell channels are set at 0V (in case of "0" data write), or set in a floating state with Vdd (in case of "1" data write, i.e., write inhibit).

When the write voltage is applied in the above-described situation, electrons are injected into the floating gate of "0" write cells while electron injection will not be generated in the "1" write cells because cell channels are boosted due to capacitive coupling.

At the verify-read step S3, verify-read is performed under the condition that the selected word line is set at verify voltage AV while non-selected word lines are set at read pass voltage Vread. At this verify-read, data is so controlled that the entire data storage circuits PDC storing one page write data become an all "1" state when data write has been completed. Detecting the all "1" state, it will be judged the write completion.

Figure 7:
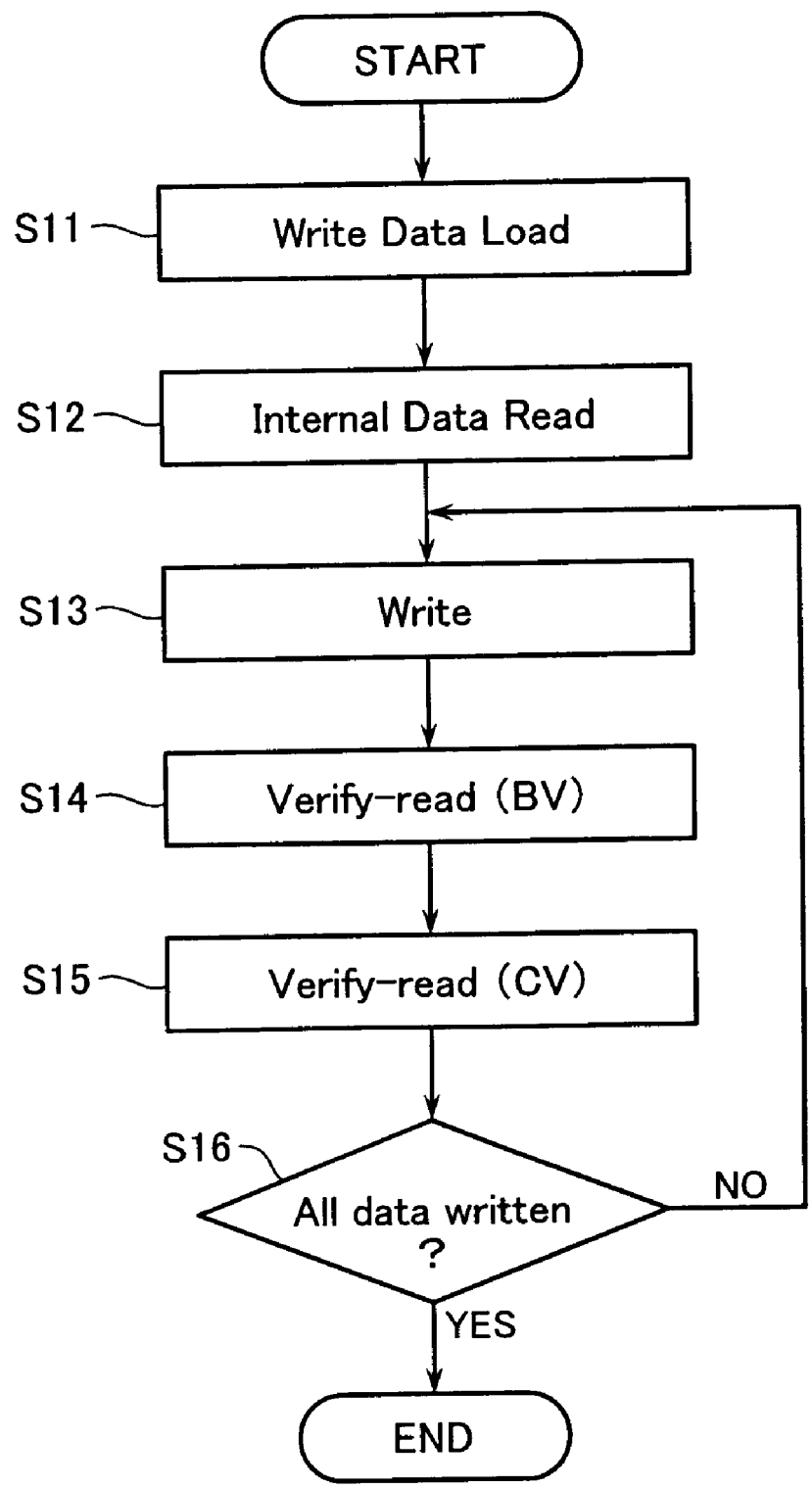
FIG. 7 shows an upper page write sequence of the flash memory.

FIG. 7 shows a second page write sequence. In the second page write sequence, it is in need of referring to the first page data. Therefore, the second page write data are loaded in data storage circuits PDC in the respective sense amplifiers SA (step S11), and the first page data, which have already been written in the cell array, are read out to be stored in data storage circuits SDC (step S12).

Then, as basically similar to the first page write, write step S13 and write-verify steps S14 and S15 are repeatedly performed until write completion is detected at the write completion judging step S16.

Verify-read is performed with the following two steps: step S14 for verifying data state "B" with verify voltage BV; and step S15 for verifying data state "C" with verify voltage CV. At these verify-read steps S14 and S15, the first page data is referred to such that verify operations are performed for the first page data "0" and "1" cells, respectively.

Next, a normal data read operation will be explained. The second page data read is performed to detect whether a selected cell is turned on or kept off under the bias condition that a selected word line is applied with a read voltage BR set between the threshold distributions of data "A" and "B"; and non-selected word lines with read pass voltage Vread. In detail, a selected bit line is precharged to a certain voltage, and then discharged for a certain time under the above-described bias condition. Detecting the bit line voltage after discharging, the selected cell's data will be sensed.

For the first page data read, it is in need of a first read step for distinguishing between data states "E" and "A" with the second page data "1", and a second read step for distinguishing between data states "B" and "C" with the second page data "0".

At the first read step, ON/OFF of the selected cell is detected with read voltage AR set between the threshold distributions of data states "E" and "A". At the second read step, ON/OFF of the selected cell is detected with read voltage CR set between the threshold distributions of data states "B" and "C".

So far, the NAND-type flash memory and basic operation thereof in accordance with this embodiment have been explained. In this embodiment, there is prepared a new method of setting the initial value of the write voltage in the wafer test, BIST, of the flash memory, which will be explained in detail below.

Figure 9:
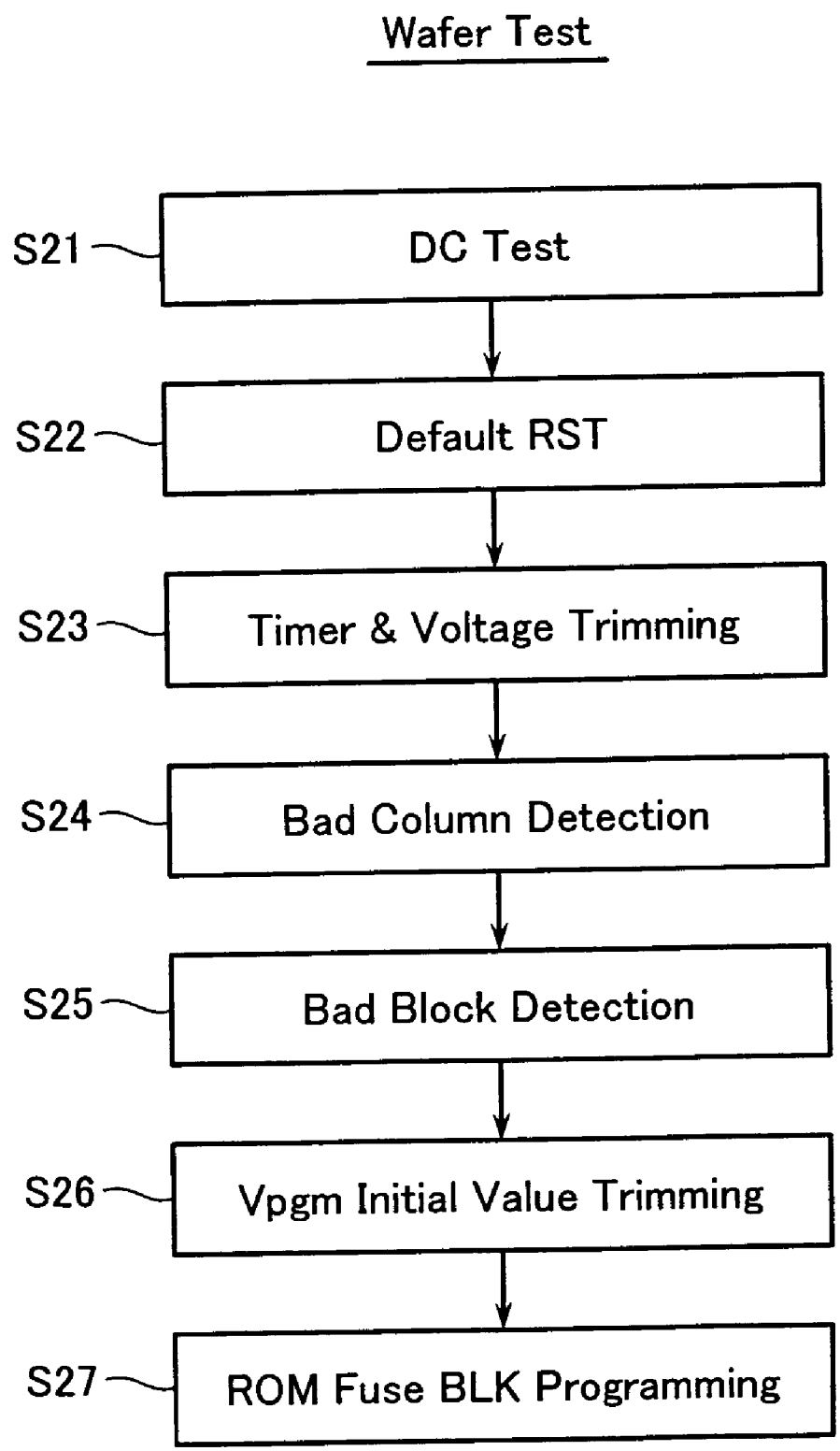
FIG. 9 shows a wafer test sequence of the flash memory.

FIG. 9 shows a schematic sequence of the wafer test. DC test (step S21) includes DC checks such as contact check, stand-by current check and so on. Default reset (step S22) is for resetting all registers to be in a default state after DC testing. Following it, trimming is performed for pulse widths of various timing pulses and voltages generated from the internal voltage generator (step S23).

Then, defective (i.e., bad) column detection and replacement (step S24), and bad block detection (step S25) are performed. In detail, a bad column(s) is replaced with a redundant column(s); and with respect to a bad block(s), a bad block flag(s) is set in the row decoder so as to make the bad block inactive hereinafter.

Then, trimming of write voltage (Vpgm) initial value is performed (step S26). At this step, the new trimming method will be used as described later. Various trimming values and defective address(es) and the like obtained as results in the wafer test are stored in the ROM fuse block 1a in the cell array 1 (step S27). These data in the ROM fuse block 1a are read out automatically at a power-on time to be stored in registers 8a and 8b.

Next, the trimming method of the Vpgm initial value included in the test sequence will be explained in detail below.

Figure 10A:
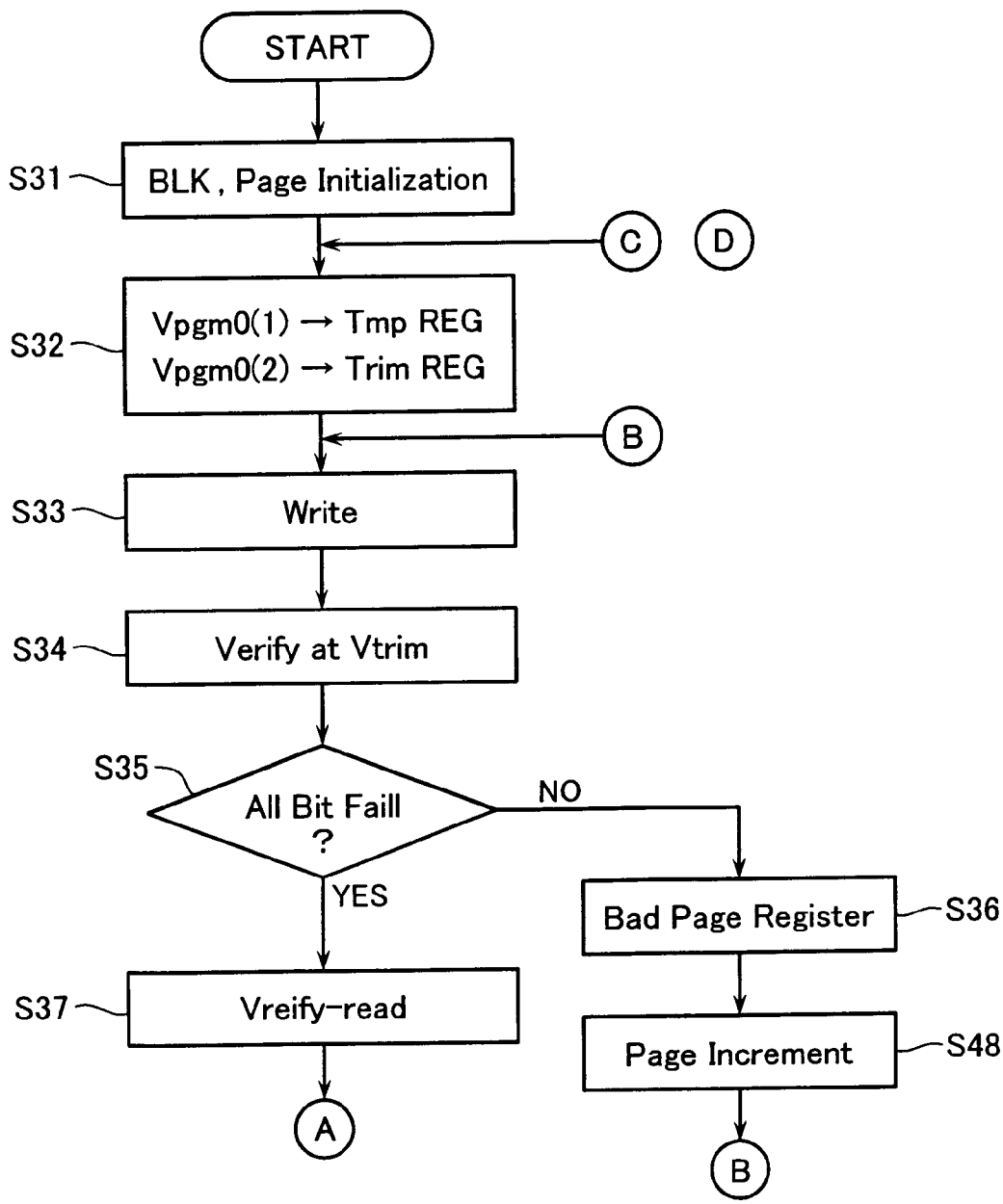
FIGS. 10A and 10B show a fast page searching sequence of the flash memory.
Figure 10B:
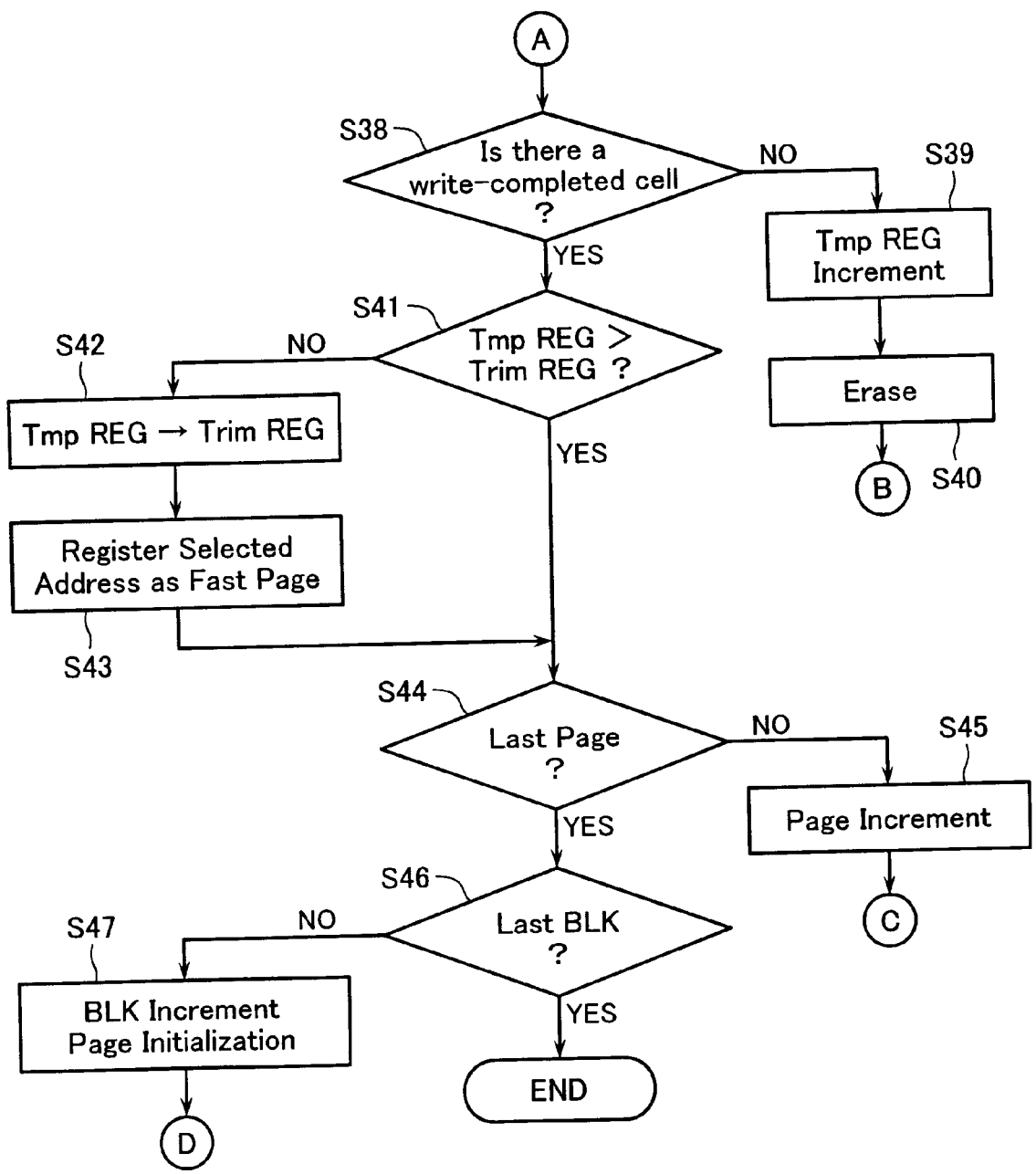

In order to set a suitable Vpgm initial value based on a page with the fastest write speed in the cell array with the exclusion of abnormal cells (such a page will be simply referred to as "fast page", hereinafter), fast page search is performed. FIGS. 10A and 10B show a sequence of the fast page search.

Figure 11:
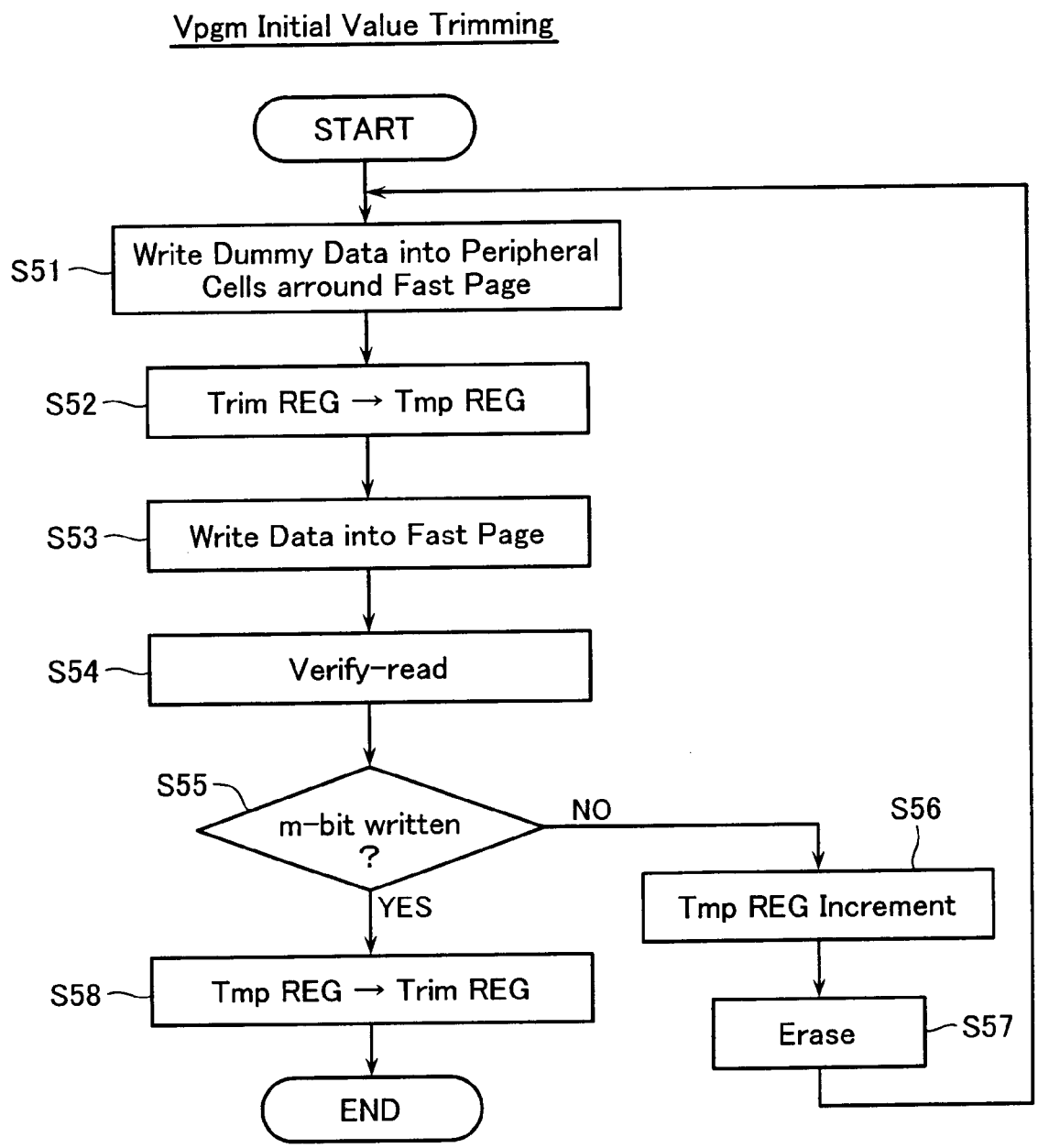
FIG. 11 shows a Vpgm initial value trimming sequence of the flash memory.

With respect to the fast page, write sequence is performed to obtain the suitable Vpgm initial value. At the trimming time of the Vpgm initial value, the influence of data writing into cells disposed adjacent to the target page will be taken into consideration, which becomes a problem when the fast page is written in practice. FIG. 11 shows the sequence of Vpgm initial value trimming.

Firstly, with reference to FIGS. 10A and 10B, the sequence of the fast page search will be explained in detail. In case of the cell array configuration shown in FIG. 2, a set of cells selected by a word line and the whole even bit lines or another set of cells selected by a word line and the whole odd bit lines serves as a page, which is a physical selection unit. By contrast, in case the sense amplifiers are prepared for the respective bit lines, a set of cell arranged along a word serves as a page.

Figure 12:
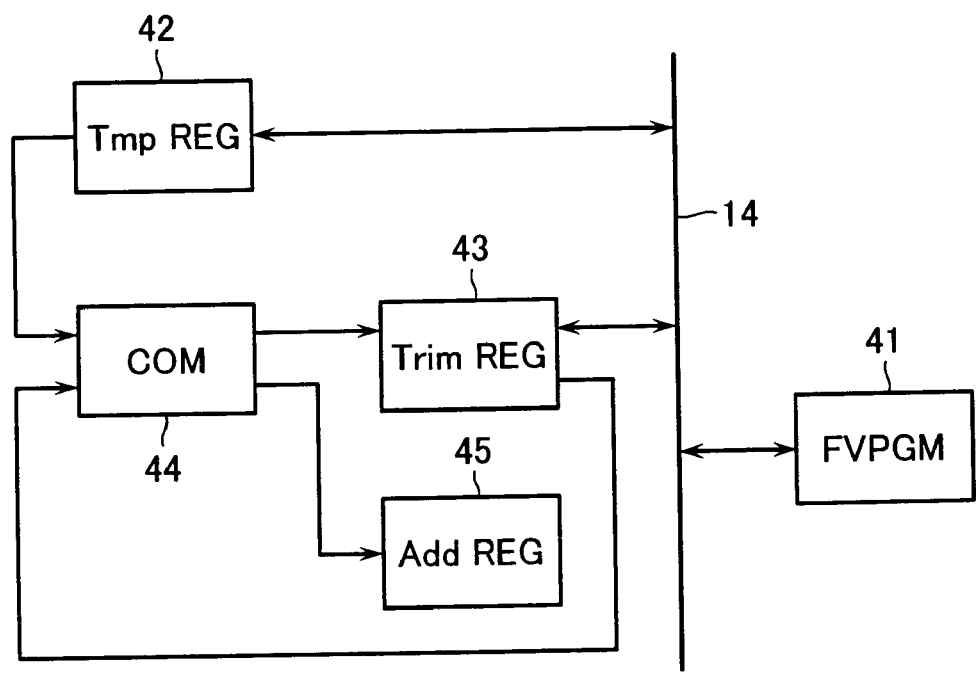
FIG. 12 shows circuit elements in relation to the Vpgm initial value trimming.

FIG. 12 shows circuit elements used in the fast page search. It is a register 41 in the external memory controller 20 that stores a starting Vpgm initial value used for the fast page search. In the chip, there are temporal register (TmpREG) 42 for temporally storing the externally supplied Vpgm initial value and trimming register (trimREG) 43. Further, there are provided comparator 44 for comparing the data in these registers with each other and address register 45 for storing searched fast page address.

Temporal register 42, comparator 44 and address register 45 may be formed as circuit elements in the internal controller 10; and trimming register 43 may be formed as a part of parameter register 8b.

First, block and page are initialized (step S31), and then write voltage initial values Vpgm0(1) and Vpgm0(2) are supplied from the outside of the chip to be stored in the temporal register (TmpREG) and trimming register (TrimREG), respectively (step S32). Note here that Vpgm initial value Vpgm0(1) is a preliminary value sufficiently lower than to-be-set Vpgm initial value; and Vpgm initial value Vpgm0(2) is such a value to be considered that at least one bit will be written in the fast page including cells to be easily written. Further, suppose here that Vpgm0(1)<Vpgm0(2). In detail, these values are supplied as binary code data.

Next, data write is performed for the head page in the head block under the control of Vpgm generation circuit in the internal voltage generator 9 based on the initial value Vpgm0(1) stored in register 42 (step S33). Suppose that all "0" data is used here as the write data for increasing the threshold voltages of all cells in the page.

With respect to the write result, verify-read is performed with a certain voltage Vtrim (step S34). For example, the upper limit of the permissible write threshold distribution may be used as the verify voltage Vtrim. However, it is desired to optionally set the voltage Vtrim in consideration of, for example, the influences of capacitance coupling between cells.

With respect to the result of the verify-read, it is detected whether all bits are FAIL or not (step S35). In case at least one bit has been detected PASS, the page is registered as a bad one, and it will be excluded from the trimming target (step S36).

This is based on the following reason: the initially supplied Vpgm initial value Vpgm0(1) is set to be sufficiently low so that cells can not reach the Vtrim as a result of the once write operation unless these are abnormal. That is, in case at least one bit is written under this condition, the page is dealt with a bad page, which includes a cell to be easily written, and excluded from the trimming target.

After having confirmed that all bits are FAIL, verify-read is performed under the condition that verify voltage thereof is set at the lower limit of the write threshold distribution (step S37), and then it is detected whether there is a write-completed cell or not (step S38). If there is not a write-completed bit, it means that the initially set Vpgm value Vpgm0(1) is too low.

In this case, the binary value (Vpgm initial value) in the register 42 will be incremented (step S39). Since the selected page cells have been written halfway at this stage, they are subjected to erase (step S40), and then data write is performed again (step S33). The above-described sequence will be repeated until it is detected that one or more bits have been written.

In case there is a cell confirmed to be written at step S38, it will be detected whether the Vpgm initial value stored in the temporal register (TmpREG) 42 is higher than that stored in the trimming register (TrimREG) 43 or not. If "NO" (i.e., in case TmpREG>TrimREG is not satisfied), it means that the currently searched page is the fast page. In this case, Vpgm initial value in the temporal register 42 is transferred to the trimming register 43 (step S42), and the selected page address will be registered as a fast page address in the address register 45 (step S43).

If the judging result is "YES" at step S41 (i.e., in case TmpREG>TrimREG is satisfied), it means that a page with a write speed higher than the currently selected page has already been detected, and Vpgm initial value thereof has been stored in the trimming register 43. Therefore, the trimming register 43 will not be rewritten.

Detecting whether it is the final page or not (step S44), the page address is incremented in case it is not the final page (step S45), and the following page will be subjected to fast page searching with the same write operation as described above.

When having reached the final page in the block, it is detected whether the block is the final one or not (step S46). If not so, the block address is incremented, and the page address is initialized (step S47), and then the following block will be searched.

As described above, performing fast page search for all blocks in the cell array, it is possible to obtain such a fast page that is the easiest to be written.

Next, with respect to the fast page obtained as described above, Vpgm trimming is performed. At this Vpgm trimming step, it is taken into consideration how the fast page write is influenced by adjacent cells which have been written.

With reference to FIG. 11, the sequence of the Vpgm initial value trimming will be explained below. First, dummy data write is performed for peripheral cells around the fast page (step S51). In case the fast page is written in practice, cells in the fast page become easy to be written due to the capacitive coupling based on the peripheral cells, in which data have been previously written. Therefore, all "0" data (dummy data) is written into the peripheral cells disposed in a certain range around the fast page, which are to be written prior to the fast page, at the step S51, so that the fast page is set in a cell circumstance state that is near the condition at the practical write time.

Under the above-described situation, Vpgm initial value stored in the trimming register 43 is transferred to the temporal register 42 (step S52), and based on it, the fast page write is performed (step S53) and then write verify-read is performed (step S54).

Completion judgment is performed under such a condition that Vpgm initial value trimming is completed when a predetermined "m" bit(s) (m is equal to 1 or more) is confirmed to be written (step S55). In case the write completion has not been confirmed, Vpgm initial value in the register 42 will be incremented to be a higher one (step S56). Following it, erase the block written halfway (step S57), and return to step S51. As a result, the same write will be repeatedly performed with the renewed Vpgm initial value as described above.

If "m" bit write has been confirmed at step S55, Vpgm initial value in the register 42 is transferred to the trimming register 43, and the Vpgm initial value trimming ends.

After finishing the test, the obtained Vpgm initial value is written into the ROM fuse block as described above.

Although there has been explained so far such a case that there is one fast page, it is possible to search and resister multiple fast pages in the cell array. Further, Vpgm initial value may be set not only for a physical fast page but also for the upper page or the lower page.

The dummy data write step S51 in FIG. 11 will be explained for a more detailed example.

Figure 13:
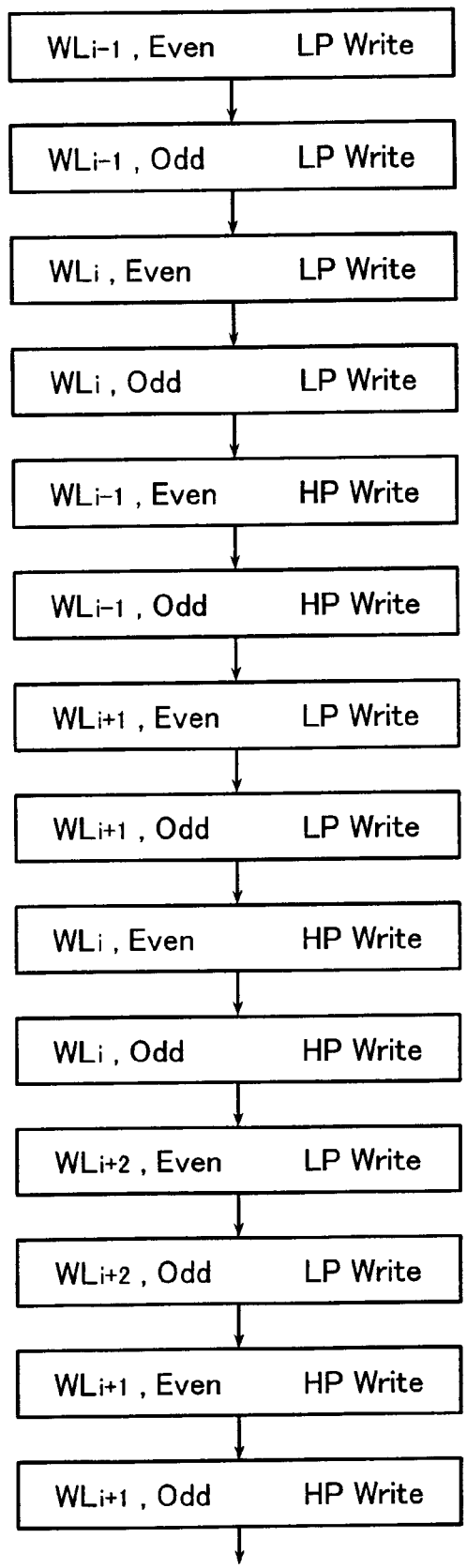
FIG. 13 shows an example of the write page selection order used in the four-level data write scheme shown in FIG. 5.

FIG. 13 shows a write order in a selected block at the data write time with four-level data write scheme shown in FIG. 5 in consideration of the range of word lines WLi−1 to WLi+2.

As a physical page, in which memory cells are simultaneously written, there are an even page (Even Page) defined by a set of cells selected by a word line and all even bit lines, and an odd page (Odd Page) defined by a set of cells selected by a word line and all odd bit lines. Combining the physical page selection with the lower page (LP) write and the upper page (HP) write, the write order shown in FIG. 13 is used.

Figure 14:
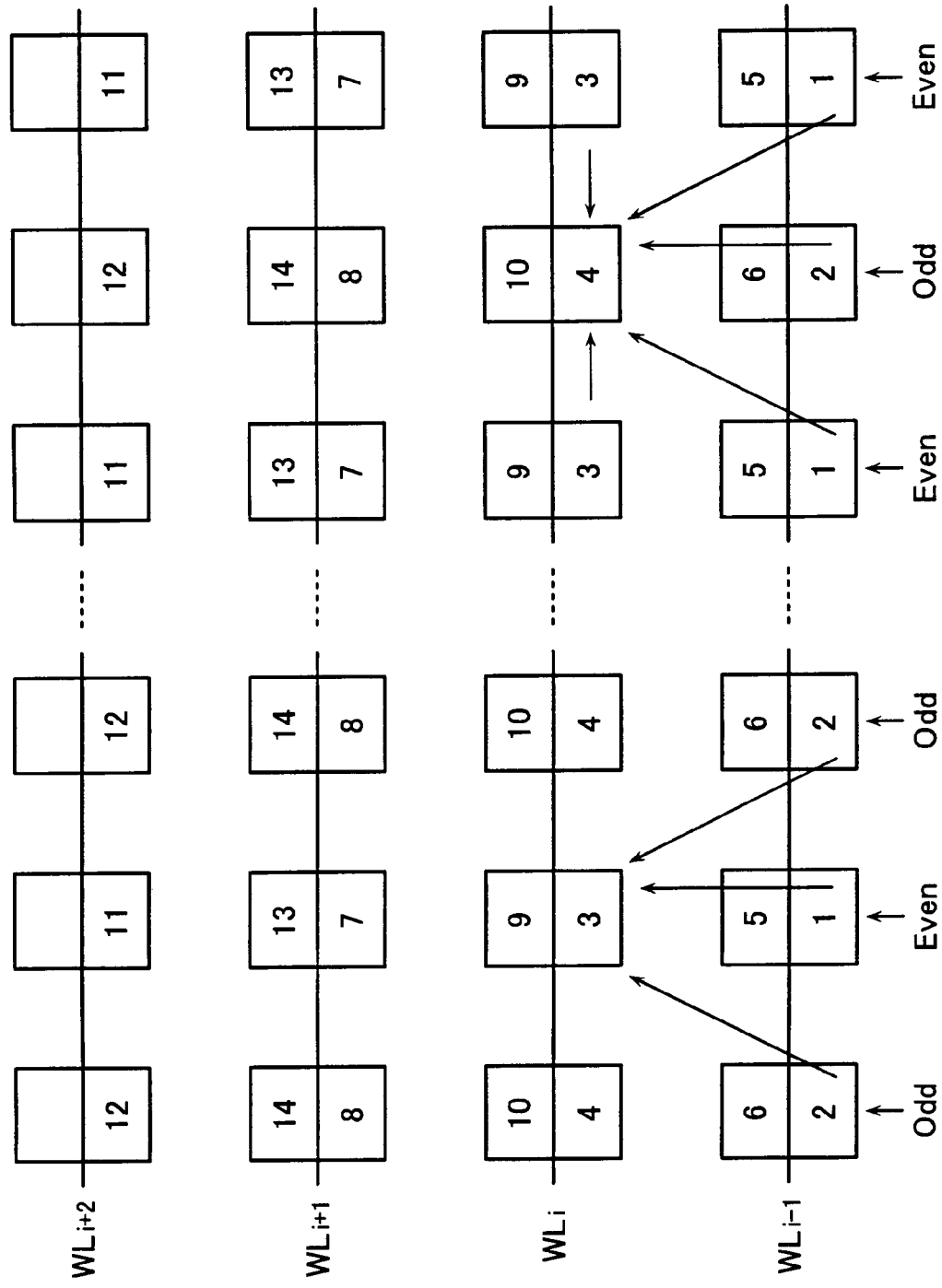
FIG. 14 shows the influence for peripheral cells at a timing of the lower page write of word line WLi.
Figure 15:
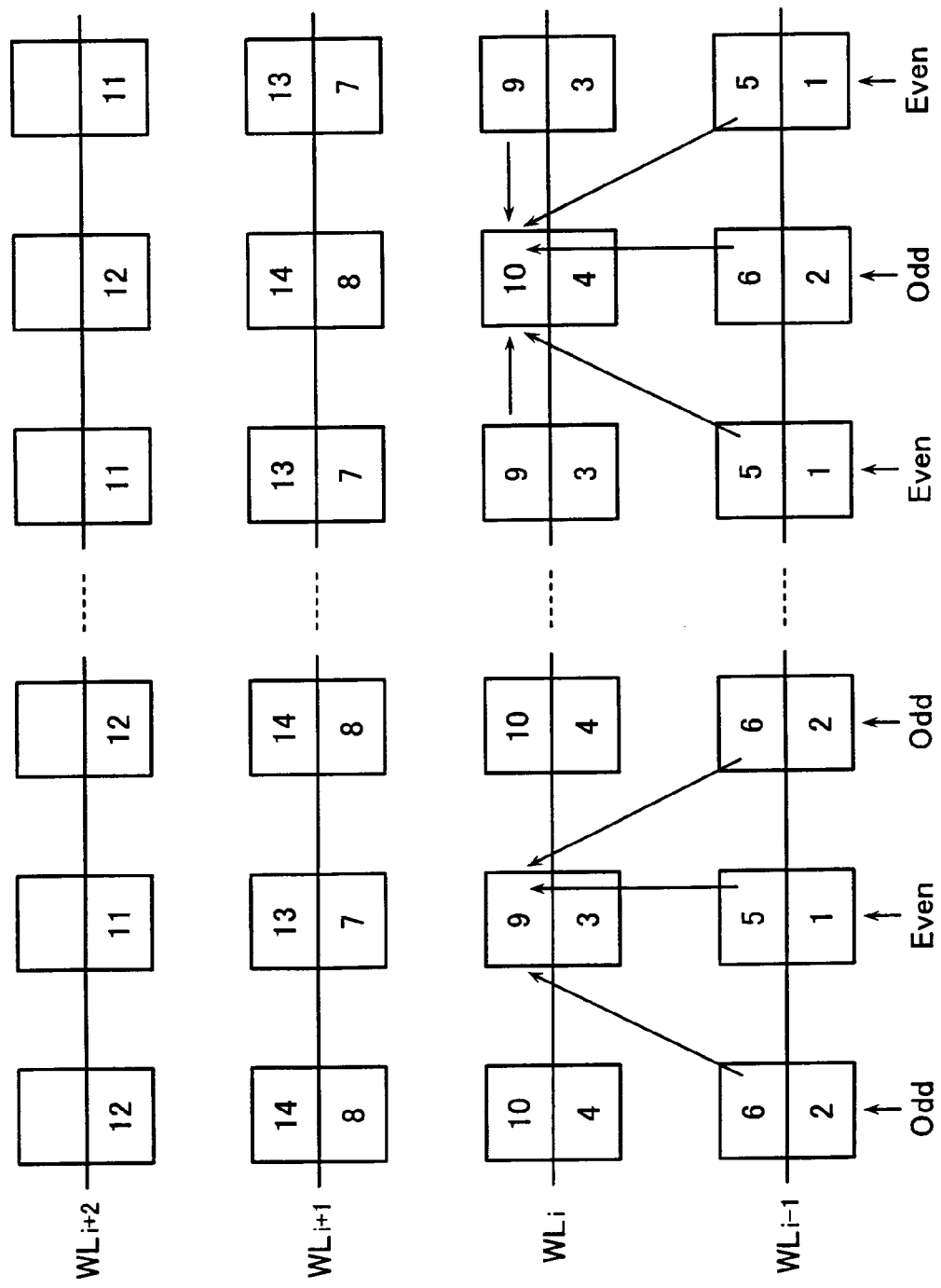
FIG. 15 shows the influence for peripheral cells at a timing of the upper page write of word line WLi.

FIGS. 14 and 15 show the write order with taking notice cells in the above-described range of word lines WLi−1 to WLi+2. In these drawings, the lower half in each square cell designates the lower page; and the upper half the upper page, in each of which the write order is indicated.

Explaining in detail, in the word line range, the lower page write in the even page of word line WLi−1 is initially performed (first); following it the lower page in the odd page of the same word line WLi−1 is performed (second); following it the lower page write in the even page of adjacent word line WLi is performed (third); following it the lower page write in the odd page of the same word line WLi is performed (fourth); following it the upper page write in the even page of the word line WLi−1 is performed (fifth); following it the upper page write in the odd page of the same word line WLi−1 is performed (sixth); following it the lower page in the even page of word line WLi+1 is performed (seventh); and following it the lower page write in the odd page of the same word line WLi+1 is performed (eighth).

The above-described multi-level data write order has already been provided as a preferable method for reducing the influence of capacitance coupling between adjacent cells.

In FIG. 14, assuming that the even page of word line WLi (third) or the odd page (fourth) is the fast page, it is shown by arrows that with respect to the lower page write of them, the lower page data previously written in the peripheral cells affect the write-ability of the fast page cell.

Therefore, noticing the lower page of the even page of word line WLi (third), as the dummy data write into peripheral cells shown in FIG. 11, all "0" write is performed for the even page (first) and odd page (second) of word line WLi−1, which are written prior to the fast page, in such a way that cell threshold voltage thereof is increased to that of the lower page data state "A". As a result, Vpgm trimming of the fast page may be performed under the same easily writable state as the fast page is written in practice.

While, noticing the lower page of the odd page of word line WLi (fourth), which is the fast page, the dummy data write (all "0" write) is performed for the even page (first) and odd page (second) of word line WLi−1, and even page (third) of word line WLi, which are written prior to the fast page, in such a way that cell threshold voltage thereof is increased to that of the lower page data state "A".

In FIG. 15, assuming that the fast page is the even page of word line WLi or the odd page, it is shown by arrows that with respect to the upper page writes (ninth and tenth) of them, the upper page data previously written in the peripheral cells affect the write-ability of the fast page cell.

Noticing the upper page of the even page of word line WLi (ninth), as the dummy data write into peripheral cells shown in FIG. 11, all "0" write is performed for the upper page (fifth) of the even page of word line WLi−1 and the upper page (sixth) of the odd page of word line WLi−1, which are written prior to the fast page, for obtaining data state "C".

While, noticing the upper page of the odd page of word line WLi (tenth), all "0" write is performed for the upper page (fifth) of the even page of word line WLi−1, the upper page (sixth) of the odd page of word line WLi−1 and the upper page (ninth) of the even page of word line WLi, which are written prior to the fast page, for obtaining data state "C".

As described above, Vpgm trimming is performed in consideration of the interference between cells at a practical write time, whereby it becomes possible to do such a high speed data write that the permissible maximum loop number is suppressed, and achieve a narrow data threshold distribution.

Further, according to this embodiment, Vpgm trimming is performed only for a previously searched fast page, whereby the test time and cost may be reduced in comparison with such a conventional scheme that Vpgm trimming is performed for all pages.

Note here that the fast page search has been used as means for trimming Vpgm initial value in the above-described embodiment, but it may be adapted to other applications. For example, it will be adapted to not only a test mode at the wafer stage but also another test mode used for checking write speed in the cell array after producing the flash memory.

As an embodiment, an electric card using the non-volatile semiconductor memory devices according to the above-described embodiments of the present invention and an electric device using the card will be described bellow.

Figure 16:
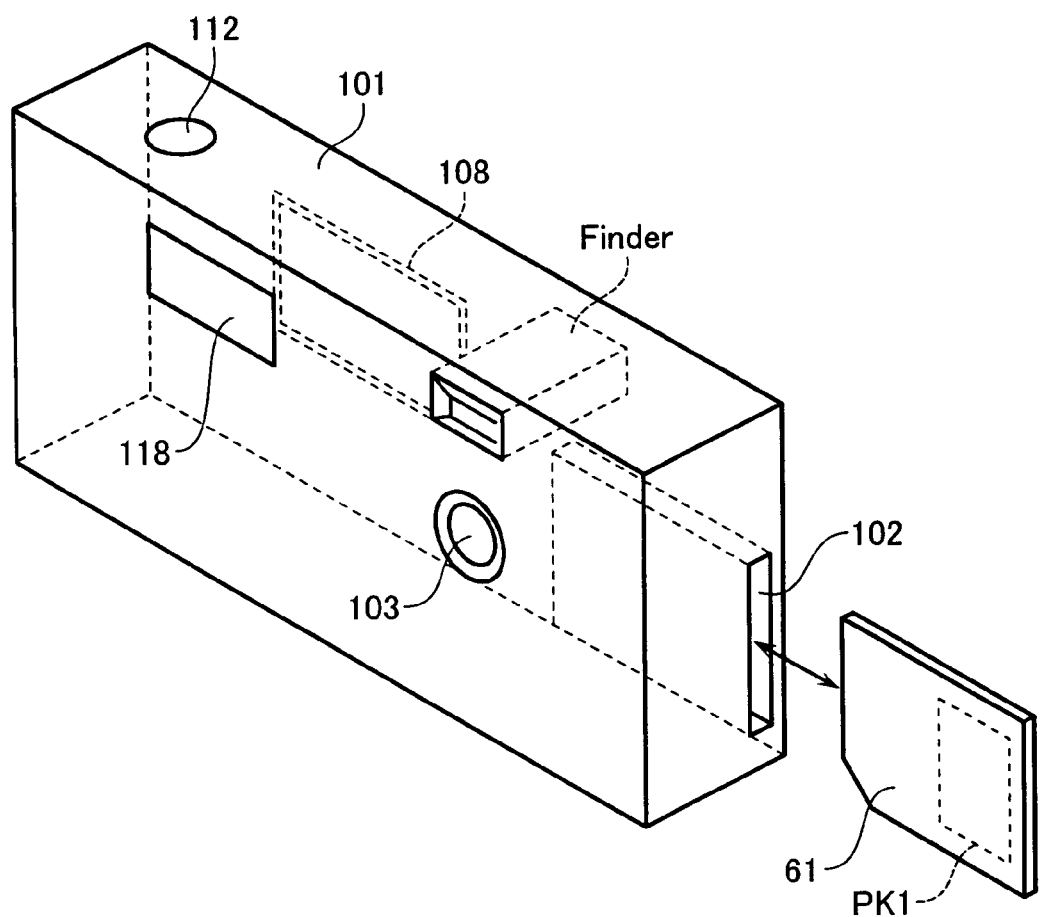
FIG. 16 shows another embodiment applied to a digital still camera.

FIG. 16 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 17:
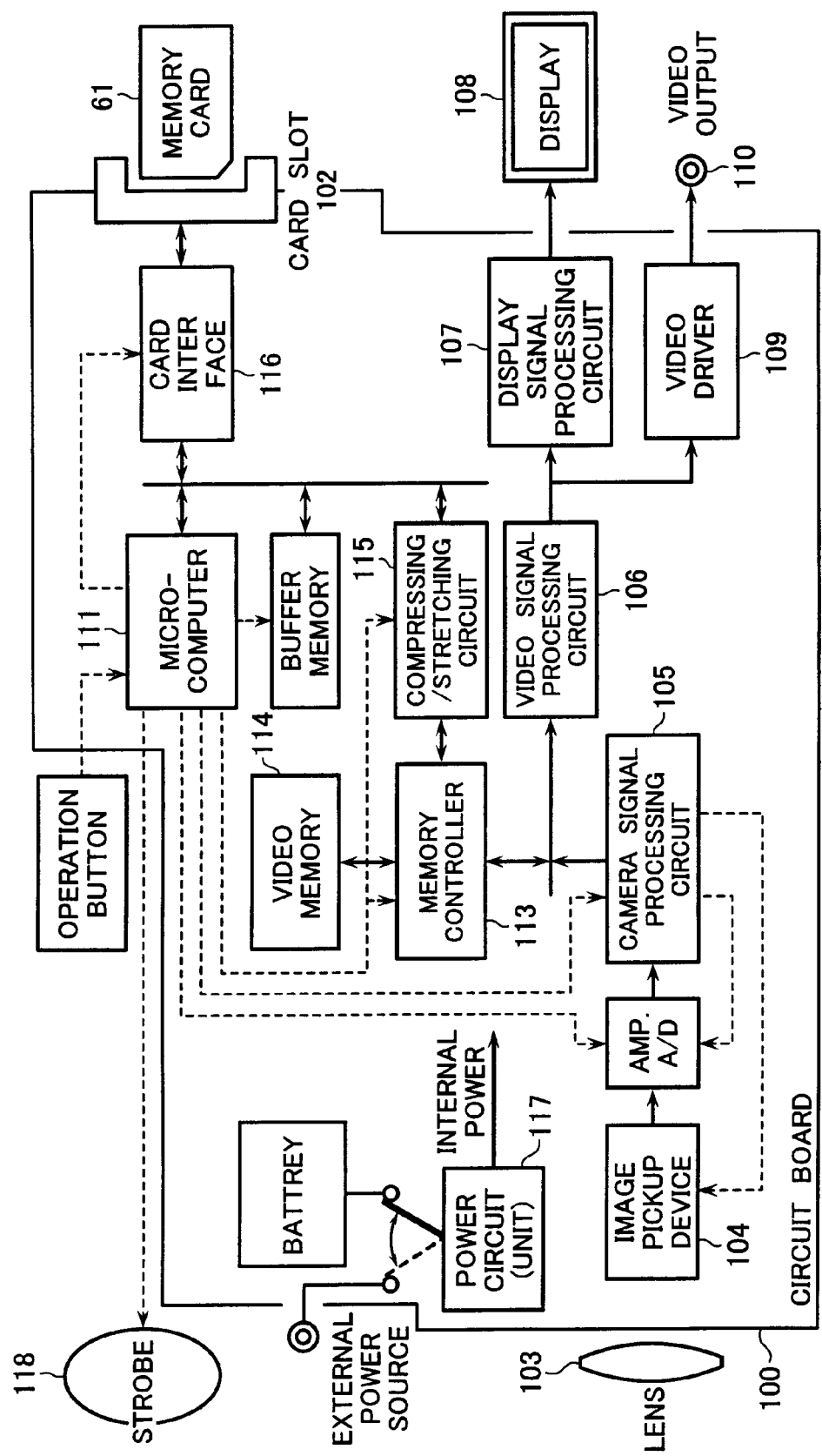
FIG. 17 shows the internal configuration of the digital still camera.
Figure 18A:
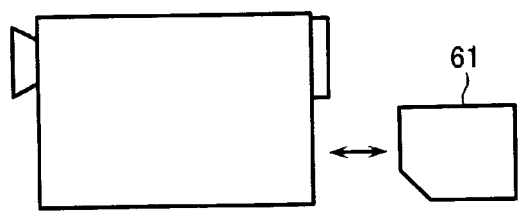
FIGS. 18A to 18J show other electric devices to which the embodiment is applied.
Figure 18F:
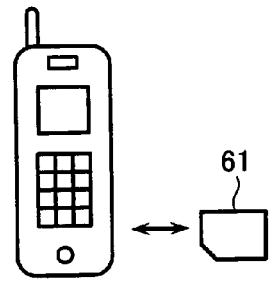
Figure 18B:
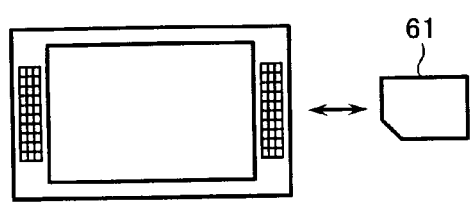
Figure 18G:
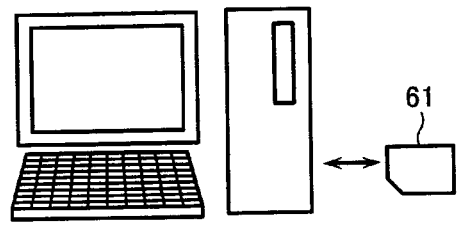
Figure 18C:
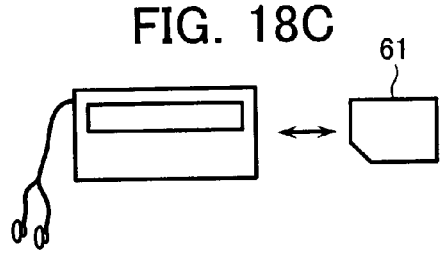
Figure 18H:
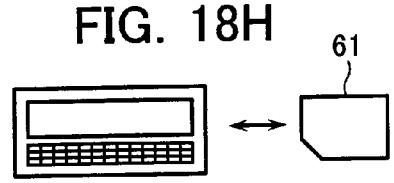
Figure 18D:
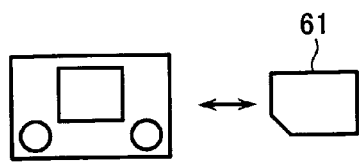
Figure 18I:
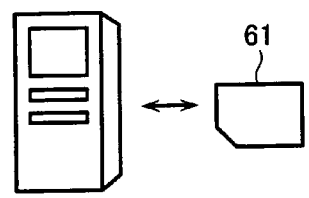
Figure 18E:
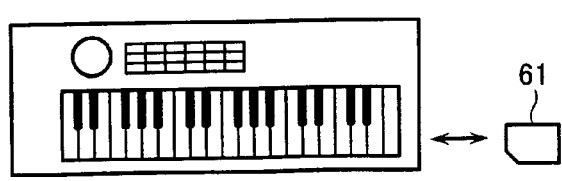
Figure 18J:
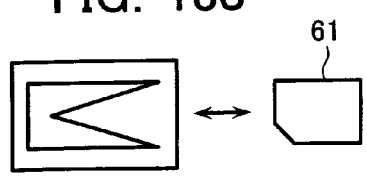

FIG. 17 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 18A to 18J, as well as in portable electric devices. That is, the electric card can also be used in a video camera shown in FIG. 18A, a television set shown in FIG. 18B, an audio apparatus shown in FIG. 18C, a game apparatus shown in FIG. 18D, an electric musical instrument shown in FIG. 18E, a cell phone shown in FIG. 18F, a personal computer shown in FIG. 18G, a personal digital assistant (PDA) shown in FIG. 18H, a voice recorder shown in FIG. 18T, and a PC card shown in FIG. 18J.

This invention is not limited to the above-described embodiments. It will be understood by those skilled in the art that various changes in form and detail may be made without departing from the spirit, scope, and teaching of the invention.

What is claimed is:

1. A semiconductor memory device comprising a memory cell array with electrically rewritable and non-volatile memory cells arranged therein, said memory cell array including plural pages of the memory cells, and
plural registers, including a temporal register, a trimming register, and an address register,
wherein
the device has such a test mode that includes a page searching sequence for searching and identifying the fast page that can be written in the fastest write speed among pages in the memory cell array and which determines a value of a program voltage Vpgm that is applied to the memory cells at the beginning of a data write operation in relation to the identified fast page;
wherein said page searching sequence comprises,
externally setting a preliminary write voltage initial value in the temporal register, writing data in multiple blocks in the memory cell array with write voltages sequentially stepped-up from the preliminary write voltage initial value until at least one bit is verified to be written for each page, transferring a write voltage currently stored in the temporal register to the trimming register as a write voltage initial value after write-verifying each page when it is lower than that stored in the trimming register, and registering a page address of the fast page defined by the write voltage initial value stored in the trimming register in the address register.

2. The semiconductor memory device according to claim 1, wherein the test mode further includes a voltage trimming sequence for executing data write into the fast page to obtain a suitable write voltage initial value.

3. The semiconductor memory device according to claim 2, wherein in the voltage trimming sequence, after executing dummy data write into peripheral cells around the fast page for reflecting influences of write data in the peripheral cells to the fast page, data write is executed into the fast page to obtain the suitable write voltage initial value.

4. The semiconductor memory device according to claim 1, wherein the memory cell array has NAND cell units arranged therein, the NAND cell unit including multiple memory cells connected in series.

5. The semiconductor memory device according to claim 1, wherein multi-level data are stored in the memory cell array.

6. A test method of a semiconductor memory device, which has a memory cell array with electrically rewritable and non-volatile memory cells arranged therein, comprising:

a page searching sequence for searching and identifying the fast page that can be written in the fastest write speed among pages in the memory cell array; and a voltage trimming sequence for executing data write into the fast page to obtain a an optimum write voltage initial value;

wherein the page searching sequence comprises:

externally setting a preliminary write voltage initial value in a temporal register;

writing data in multiple blocks in the memory cell array with write voltages sequentially stepped-up from the preliminary write voltage initial value until at least one bit is verified to be written for each page;

transferring a write voltage currently stored in the temporal register to a trimming register as a write voltage initial value after write-verifying each page when it is lower than that stored in the trimming register; and registering a page address of the fast page defined by the write voltage initial value stored in the trimming register in an address register.

7. The test method according to claim 6, wherein the voltage trimming sequence comprises:

writing dummy data into peripheral cells around the fast page, the peripheral cells being to be written prior to the fast page in a practical case;

transferring the write voltage initial value stored in the trimming register to the temporal register;

repeatedly writing data in the fast page and verify-reading it with write voltages sequentially stepped-up from the write voltage initial value stored in the temporal register until verifying that a certain "in" bit(s) (where, m is equal to 1 or more) has been written; and transferring a write voltage currently stored in the temporal register after write-verifying to the trimming register as the suitable write voltage initial value.

8. The test method according to claim 7, wherein the suitable write voltage initial value obtained in the voltage trimming sequence is written into a ROM fuse circuit.

9. The test method according to claim 7, wherein the dummy data is all "0" data for increasing threshold voltages of the peripheral cells.

10. The test method according to claim 8, wherein in case the "in" bit write has not been verified, after erasing the block written halfway and stepping-up the write voltage in the temporal register, the successive write and verify-read are repeated.

11. The test method according to claim 6, wherein the memory cell array has NAND cell units arranged therein, the NAND cell unit including multiple memory cells connected in series.

12. The test method according to claim 6, wherein multi-level data are stored in the memory cell array.

13. The test method according to claim 6, wherein the page searching sequence further comprises:

applying the write voltage equal to the preliminary write voltage initial value to a page;

verify-reading the page with a certain verify voltage to detect whether all bits in the page are FAIL or not;

if at least one bit is detected as PASS, excluding the page from a target of the voltage trimming sequence.

14. The test method according to claim 13, wherein the page searching sequence further comprises:

verify-reading the page with a verify voltage that is set at the lower limit of the write threshold distribution to detect whether at least one bit is PASS or not, if not, incrementing the write voltage stored in the trimming register.

* * * * *